United States Patent
Do et al.

(10) Patent No.: US 9,305,873 B1
(45) Date of Patent: Apr. 5, 2016

(54) INTEGRATED CIRCUIT PACKAGING SYSTEM WITH ELECTRICAL INTERFACE AND METHOD OF MANUFACTURE THEREOF

(71) Applicants: Byung Tai Do, Singapore (SG); Arnel Senosa Trasporto, Singapore (SG); Linda Pei Ee Chua, Singapore (SG)

(72) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/254,584

(22) Filed: Apr. 16, 2014

Related U.S. Application Data

(62) Division of application No. 13/102,047, filed on May 5, 2011, now Pat. No. 8,759,159.

(51) Int. Cl.
*H01L 23/495* (2006.01)
*H01L 23/498* (2006.01)

(52) U.S. Cl.
CPC ................................ *H01L 23/49811* (2013.01)

(58) Field of Classification Search
CPC ................... H01L 23/49503; H01L 23/49811
USPC ................... 257/676, 737, 782, 784, E23.037
See application file for complete search history.

(56) References Cited

U.S. PATENT DOCUMENTS

| | | | |
|---|---|---|---|
| 2008/0203546 A1 | 8/2008 | Maloney et al. | |
| 2009/0152696 A1 | 6/2009 | Dimasacat et al. | |
| 2009/0166824 A1 | 7/2009 | Do et al. | |
| 2011/0068463 A1 | 3/2011 | Camacho et al. | |
| 2011/0079888 A1* | 4/2011 | Bathan et al. | 257/676 |
| 2012/0241962 A1* | 9/2012 | Camacho | 257/768 |

* cited by examiner

*Primary Examiner* — Thien F Tran
(74) *Attorney, Agent, or Firm* — Ishimaru & Asociates LLP

(57) ABSTRACT

A method of manufacture of an integrated circuit packaging system includes: forming an isolated contact having a contact protrusion, the contact protrusion having a lower protrusion surface, an upper protrusion surface, and a protrusion sidewall; forming a die paddle, adjacent to the isolated contact, having a die paddle protrusion, the die paddle protrusion having a lower die protrusion surface, an upper die protrusion surface, and a die protrusion sidewall; depositing a contact pad on the contact protrusion; depositing a die paddle pad on the die paddle protrusion; coupling an integrated circuit die to the contact protrusion; and molding an encapsulation on the integrated circuit die.

10 Claims, 5 Drawing Sheets

INTEGRATED CIRCUIT PACKAGING SYSTEM WITH ELECTRICAL INTERFACE AND METHOD OF MANUFACTURE THEREOF

CROSS-REFERENCE TO RELATED APPLICATION(S)

This is a divisional of U.S. patent application Ser. No. 13/102,047 filed May 5, 2011, now U.S. Pat. No. 8,759,159.

TECHNICAL FIELD

The present invention relates generally to an integrated circuit packaging system, and more particularly to a system for the integrated circuit packaging system having an electrical interface.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. In packaging components, the need for connecting packages with ever smaller connections influences robustness of the connections.

Traditional electrical connections rely on adhesion efficiency between the material used and the contact. This leads to connections that are prone to delamination and breaking under stress. Unfortunately, the more of the material that is applied, the more likely that a short circuit can occur.

Thus, a need still remains for improving connections between packages without sacrificing yield and reliability. In view of the increasing demands placed on our electronics, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming an isolated contact having a contact protrusion, the contact protrusion having a lower protrusion surface, an upper protrusion surface, and a protrusion sidewall; forming a die paddle, adjacent to the isolated contact, having a die paddle protrusion, the die paddle protrusion having a lower die protrusion surface, an upper die protrusion surface, and a die protrusion sidewall; depositing a contact pad on the contact protrusion; depositing a die paddle pad on the die paddle protrusion; coupling an integrated circuit die to the contact protrusion; and molding an encapsulation on the integrated circuit die.

The present invention provides an integrated circuit packaging system, including: an isolated contact having a contact body and a contact protrusion, the contact protrusion having a contact pad on a lower protrusion surface, an upper protrusion surface, and a protrusion sidewall; a die paddle having a die paddle protrusion, the die paddle protrusion having a die paddle pad on a lower die protrusion surface, an upper die protrusion surface, and a die protrusion sidewall; an integrated circuit die over the die paddle protrusion; and an encapsulation on the integrated circuit die and partially covering the isolated contact, the contact pad and part of the contact body exposed from the encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
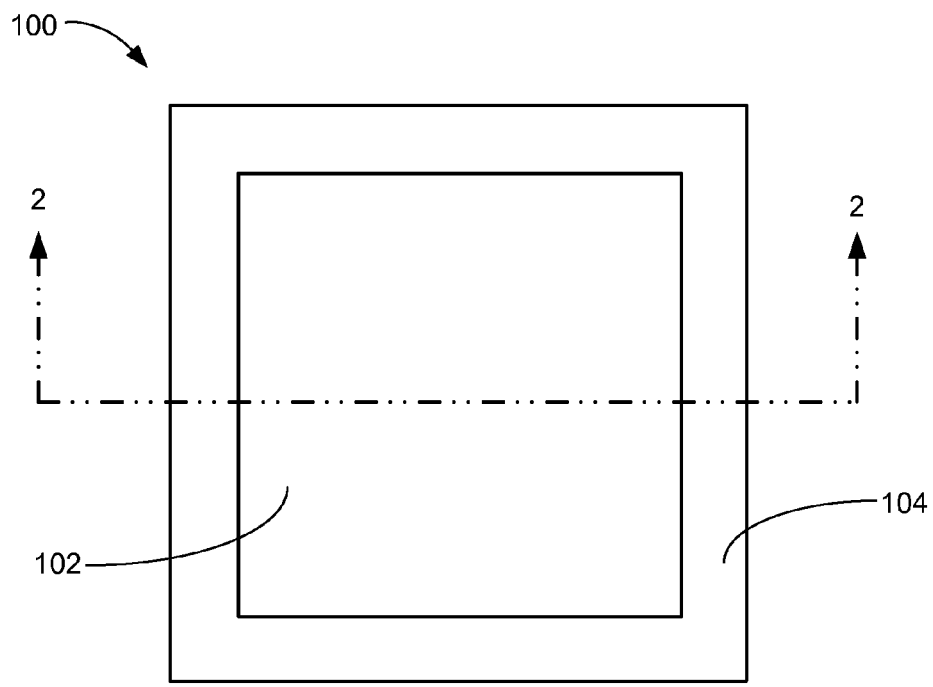
FIG. 1 is a top view of the integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of the integrated circuit packaging system 100 in a first embodiment of the present invention. The integrated circuit packaging system 100 is shown having an encapsulation 102 and a substrate 104. The encapsulation 102 is defined as a cover for surrounding and protecting the contents within the integrated circuit packaging system 100 from the environment. For example, the encapsulation 102 can be a material such as film assisted molding, epoxy molding, or other protective molding. The encapsulation 102 can function to protect sensitive components from moisture, dust and other contamination.

The substrate 104 is defined as a structure containing conductive traces and contacts. For example, the substrate 104 can be a laminate material, metallic, ceramic, or some combination thereof. The substrate 104 can have contact pads for connection to other components or next level systems. Also for example, the substrate 104 can be larger than the encapsulation 102.

For illustrative purposes, the substrate 104 is described as being larger than the encapsulation 102 although it is understood that the substrate 104 may be a different relative size. For example, the substrate 104 can be smaller or the same size as the encapsulation 102.

Figure 2:
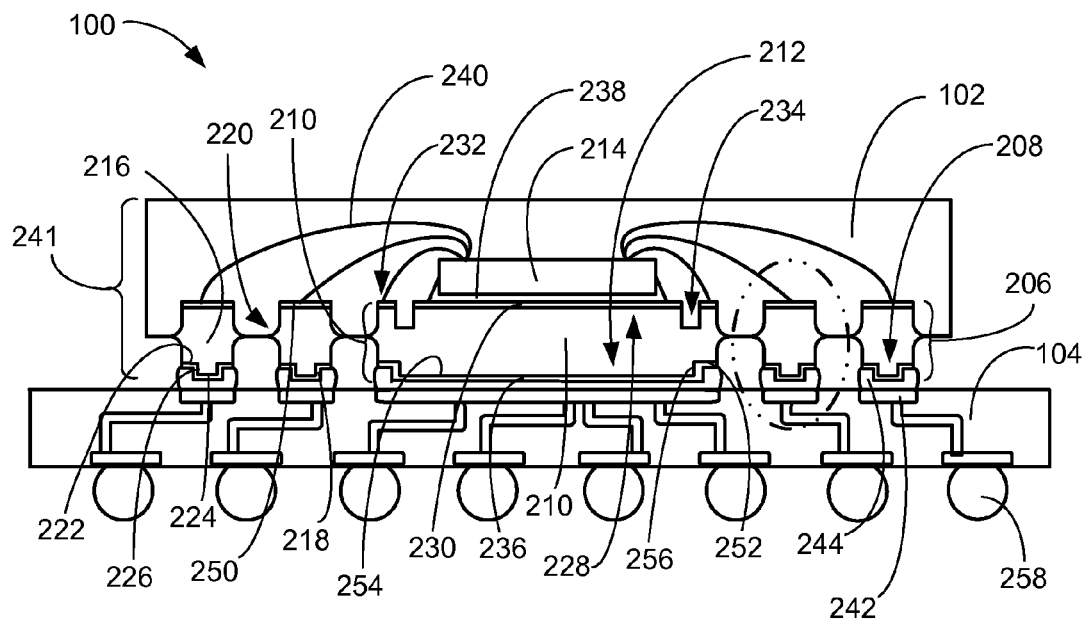
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having an isolated contact 206 having a contact protrusion 208, a die paddle 210 having a die paddle protrusion 212, an integrated circuit die 214, the encapsulation 102, and the substrate 104, as an example.

The isolated contact 206 is defined as a standalone interconnect structure with an extended feature on the bottom. The isolated contact 206 includes a contact body 216, the contact protrusion 208, a contact pad 218, and a bond pad 250. The isolated contact 206 can function to serve as an external connection to other systems for the integrated circuit die 214. For example, the isolated contact 206 can connect to the substrate 104 or to a next level system (not shown). The isolated contact 206 can be partially embedded in the encapsulation 102, leaving the contact protrusion 208 and the contact pad 218 exposed, along with part of the contact body 216.

The contact body 216 is defined as the base structure of the isolated contact 206 from which the contact protrusion 208 extends, and the structure on which the contact pad 218 and the bond pad 250 can be formed. The contact body 216 can be made from many different materials such as copper, tin, zinc, or other conductive metal or alloys. For example, the contact body 216 can have a distinctive shape which includes the contact protrusion 208 and a side protrusion 220.

The side protrusion 220 is defined as an extension coming out of the non-horizontal side of the isolated contact 206 or the die paddle 210. For example, the side protrusion 220 can be formed on the sides of the contact body 216 and can have different shapes. For example, if the side protrusions 220 are formed as part of an etching process, the side protrusions 220 can take the shape of two concave surfaces converging or merging to a point.

The contact protrusion 208 is defined as a portion of the contact body 216 extending from the bottom of the isolated contact 206. The structure of the contact protrusion 208 includes an upper protrusion surface 222, a lower protrusion surface 224, and a protrusion sidewall 226. The contact protrusion 208 can be formed in a number of ways. For example, the contact protrusion 208 can be formed by stamping, cutting, drilling, etching, or other process for physically shaping metal.

The upper protrusion surface 222 is defined as the portion of the contact protrusion 208 on the outer perimeter of the contact protrusion 208. For example, the upper protrusion surface 222 can extend from the vertical edge of the bottom of the isolated contact 206 to the protrusion sidewall 226. The upper protrusion surface 222 can be horizontally planar.

The protrusion sidewall 226 is defined as the side of the contact protrusion 208 that extends vertically from the bottom of the isolated contact 206. For example, the protrusion sidewall 226 can extend from the inner edge of the upper protrusion surface 222 to the outer edge of the lower protrusion surface 224. The protrusion sidewall 226 can be vertically planar and can be perpendicular to the upper protrusion surface 222 and the lower protrusion surface 224.

The lower protrusion surface 224 is defined as the bottom of the contact protrusion 208 inside the area defined by the protrusion sidewall 226. For example, the lower protrusion surface 224 can be perpendicular to the protrusion sidewall 226 and can be horizontally planar. The lower protrusion surface 224 can also be parallel with the upper protrusion surface 222, for example. The lower protrusion surface 224, the upper protrusion surface 222, and the protrusion sidewall 226 can be covered by the contact pad 218.

It has been discovered that the contact protrusion 208 having a shape defined by the upper protrusion surface 222, the lower protrusion surface 224, and the protrusion sidewall 226 increases reliability of the connection between the isolated contact 206 and another system due to stronger resistance to multidirectional and shear forces in the solder used to connect the isolated contact 206 and another system. For example, because the solder will surround the contact protrusion 208, the resistance to shear forces is not determined merely by the contact adhesion but is also determined by the physical locking of the contact protrusion 208 in the solder. The lower protrusion surface 224 and the protrusion sidewall 226 extending into the solder can help prevent the solder from breaking or delaminating due to shear forces that can be caused by a difference in the thermal expansion of the substrate 104 and a package defined by the shape of the encapsulation 102.

The contact pad 218 is defined as a conductive material on the contact protrusion 208. The contact pad 218 can be a thin layer of conductive metal. The contact pad 218 covers only the upper protrusion surface 222, the lower protrusion surface 224, and the protrusion sidewall 226.

The contact pad 218 can be formed in a number of ways. For example, the contact pad 218 can be formed by a process such as sputtering, electroplating, or chemical vapor deposition (CVD). The contact pad 218 can be made from a metal such as gold, silver, nickel, copper, other conductive metal, or a solder-wettable material.

The bond pad 250 is defined as a conductive material on the top of the isolated contact 206. The bond pad 250 can be a thin layer of conductive metal. The bond pad 250 covers only the top of the isolated contact 206. The bond pad 250 can be formed in a number of ways. For example, the bond pad 250 can be formed by a process such as sputtering, electroplating, or chemical vapor deposition (CVD). The bond pad 250 can be made from a metal such as gold, silver, nickel, copper, other conductive material.

The die paddle 210 is defined as a supportive structure proximate to interface contacts and made from the same material as the interface contacts. For example, the die paddle 210 can include a top surface 228, a die attach pad 230, a die paddle perimeter 232, an isolation groove 234, the die paddle protrusion 212, and a die paddle pad 236. The die paddle 210 can be made from many different materials such as copper, tin, zinc, or other conductive metal or alloys. For example, the die paddle 210 can have a distinctive shape which includes the die paddle protrusion 212 and the side protrusion 220.

The side protrusion 220 can be formed on the sides of the die paddle 210 and can have different shapes. For example, if the side protrusions 220 are formed as part of an etching process, they can take the shape of two concave surfaces converging or merging to a point.

The top surface 228 is defined as the top of the die paddle 210. The top surface 228 can include the die attach pad 230, the die paddle perimeter 232, and the isolation groove 234.

The die attach pad 230 is defined as the location upon which the integrated circuit die 214 is attached. The die attach pad 230 can be a thin layer of conductive metal. The die attach pad 230 can partially cover the top surface 228 of the die attach pad 230.

The die paddle perimeter 232 is defined as the outer perimeter region of the top surface 228 of the die paddle 210. The die paddle perimeter 232 can be covered by a thin layer of conductive material. The die paddle perimeter 232 can be used as a connection to ground.

The isolation groove 234 is defined as a cut into the top surface 228 of the die paddle 210 between the die attach pad 230 and the die paddle perimeter 232. For example, the isolation groove 234 can be wide enough so that the encapsulation 102 can flow into the isolation groove 234. The isolation groove 234 can be free of the conductive metal that the die attach pad 230 is created from and contain only the encapsulation 102.

The isolation groove 234 can be formed in a number of ways. For example, the isolation groove 234 can be formed by a process such as sawing, laser cutting, or drilling. The isolation groove can function to keep the die paddle perimeter 232 free of adhesive used to attach the integrated circuit die 214. The die paddle protrusion 212 is defined as a portion of the die paddle 210 extending from the bottom of the die paddle 210. The structure of the die paddle protrusion 212 includes an upper die protrusion surface 252, a lower die protrusion surface 254, and a die protrusion sidewall 256. The die paddle protrusion 212 can be formed in a number of ways. For example, the die paddle protrusion 212 can be formed by stamping, cutting, drilling, etching, or other process for physically shaping metal.

The upper die protrusion surface 252 is defined as the portion of the die paddle protrusion 212 on the outer perimeter of the die paddle protrusion 212. For example, the upper die protrusion surface 252 can extend from the vertical edge of the bottom of the die paddle 210 to the protrusion sidewall 226. The upper die protrusion surface 252 can be horizontally planar.

The die protrusion sidewall 256 is defined as the side of the die paddle protrusion 212 that extends vertically from the bottom of the isolated contact 206 or the die paddle protrusion 212. For example, the die protrusion sidewall 256 can extend from the inner edge of the upper die protrusion surface 252 to the outer edge of the lower die protrusion surface 254. The die protrusion sidewall 256 can be vertically planar and can be perpendicular to the upper die protrusion surface 252 and the lower die protrusion surface 254.

The lower die protrusion surface 254 is defined as the bottom of the contact protrusion 208 or the die paddle protrusion 212 inside the area defined by the die protrusion sidewall 256. For example, the lower die protrusion surface 254 can be perpendicular to the die protrusion sidewall 256 and can be horizontally planar. The lower die protrusion surface 254 can also be parallel with the upper die protrusion surface 252, for example. The lower die protrusion surface 254, the upper die protrusion surface 252, and the die protrusion sidewall 256 can be covered by the die paddle pad 236.

It has been discovered that the die paddle protrusion 212 having a shape defined by the upper die protrusion surface 252, the lower die protrusion surface 254, and the die protrusion sidewall 256 increases reliability of the connection between the die paddle 210 and another system due to stronger resistance to multidirectional and shear forces in the solder used to connect the die paddle 210 and another system. For example, because the solder will surround the die paddle protrusion 212, the resistance to shear forces is not determined merely by the contact adhesion but is also determined by the physical locking of the die paddle protrusion 212 in the solder. The lower die protrusion surface 254 and the die protrusion sidewall 256 extending into the solder can help prevent the solder from breaking or delaminating due to shear forces that can be caused by a difference in the thermal expansion of the substrate 104 and a package defined by the shape of the encapsulation 102.

The die paddle pad 236 is defined as a conductive metal on the die paddle protrusion 212. The die paddle pad 236 can be a thin layer of conductive metal. The die paddle pad 236 covers only the upper die protrusion surface 252, the lower die protrusion surface 254, and the die protrusion sidewall 256.

The die paddle pad 236 can be formed in a number of ways. For example, the die paddle pad 236 can be formed by a process such as sputtering, electroplating, or chemical vapor deposition (CVD). The die paddle pad 236 can be made from a metal such as gold, silver, nickel, copper, other conductive metal, or a solder-wettable material.

The integrated circuit die 214 is defined as a chip containing active circuitry. The integrated circuit die 214 is attached to the die attach pad 230 with a die attach adhesive 238. The integrated circuit die 214 is positioned above the die attach pad 230. The die attach adhesive 238 is defined as a substance used to bond two or more solid elements together. The die attach adhesive 238 can be a resin, glue, paste, cement, putty, or a polyvinyl resin emulsion. The die attach adhesive 238 can partially cover the die attach pad 230 and can partially cover the sides of the integrated circuit die 214.

The integrated circuit die 214 can be attached to the die attach pad 230 with the passive side facing down and the active side facing up. The integrated circuit die 214 can be connected to the isolated contact 206 with bond wires 240.

An integrated circuit package 241 includes the isolated contact 206, the die paddle 210, the integrated circuit die 214, and the encapsulation 102. The encapsulation 102 separates a plurality of the isolated contact 206 and maintains the structure of the integrated circuit package 241.

The encapsulation 102 can have a planar surface on the top and sides of the encapsulation 102. The encapsulation can be exposed on the bottom surface of the encapsulation between the die paddle 210 and the isolated contact 206. The encapsulation 102 can leave exposed the bottom of the isolated contact 206 and the die paddle 210.

The substrate 104 can be a structure with conductive traces. For example, the substrate 104 can be a laminate material, metallic, ceramic, or some combination thereof. The substrate 104 includes a substrate contact 242. The substrate contact 242 is defined as the location where conductive material 244 will be used to connect to the isolated contact 206 or the die paddle 210.

The conductive material 244 is defined as a metallic mixture used to bridge contacts. For example, the conductive material 244 can be solder, a conductive paste, or a conductive resin. The conductive material 244 can bridge different kinds of contacts. For example, the conductive material 244 can connect the isolated contact 206 and the substrate contact 242. Also for example, the conductive material 244 can connect the die paddle 210 and the substrate contact 242.

The conductive material 244 can conform to the contact pad 218 if the contact pad 218 is formed from solder-wettable material. For example, the conductive material 244 can cover the upper die protrusion surface 252, the lower die protrusion surface 254, and the die protrusion sidewall 256 while not covering the contact body 216.

The substrate 104 can have system interconnects 258. The system interconnects 258 are defined as an external connection for connection to a next level system (not shown). The system interconnects 258 can be solder balls, solder bumps, solder columns, gold bumps, or stud bumps.

It has been discovered that the die paddle protrusion 212 and the contact protrusion 208 having a shape defined by the upper die protrusion surface 252, the lower die protrusion surface 254, and the die protrusion sidewall 256 lowers the defect rate of the connection between the isolated contact 206 or the die paddle 210 and another system due to stronger resistance to multidirectional and shear forces in the conductive material 244 used to connect the isolated contact 206 and another system. For example, because the conductive material 244 will surround the contact protrusion 208, the resistance to shear forces is not determined merely by the contact adhesion of the conductive material 244 to the contact pad 218, but is also determined by the physical locking of the contact protrusion 208 in the conductive material 244. The lower die protrusion surface 254 and the die protrusion sidewall 256 extending into the conductive material 244 can help prevent the conductive material 244 from breaking or delaminating due to shear forces that can be caused by a difference in the thermal expansion of the substrate 104 and the integrated circuit package 241.

Figure 3:
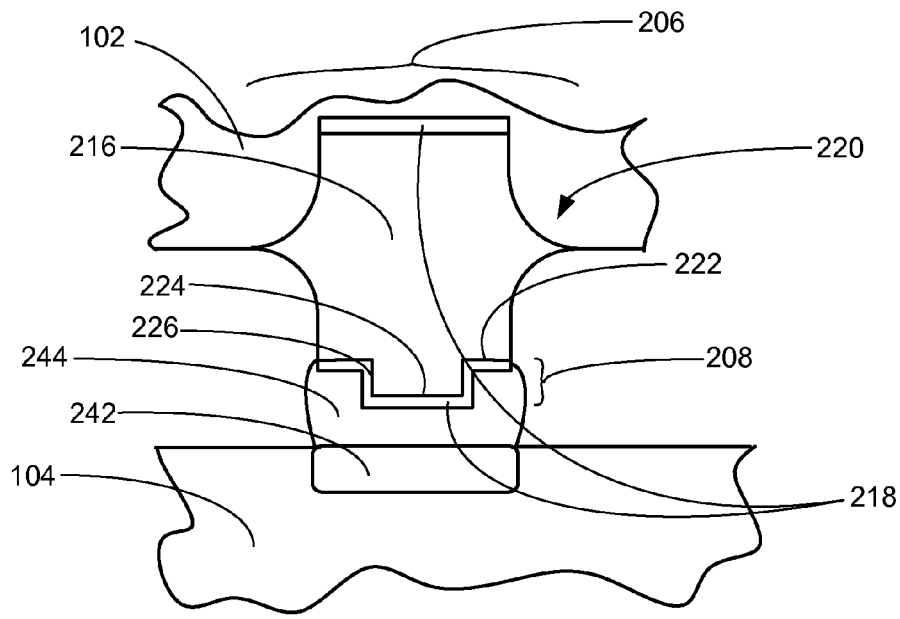
FIG. 3 is a partial cross-sectional view of the integrated circuit packaging system in the inset of FIG. 2 depicted by the dashed-dot oval.

Referring now to FIG. 3, therein is shown a partial cross-sectional view of the integrated circuit packaging system 100 in the inset of FIG. 2 depicted by the dashed-dot oval. The partial cross-sectional view of the integrated circuit packaging system 100 is shown having the isolated contact 206, the conductive material 244, the encapsulation 102, and the substrate 104. Features shown are identical to those shown in FIG. 2 but are shown larger and further described for clarity.

The isolated contact 206 includes the contact body 216, the contact protrusion 208, and the contact pad 218. The isolated contact 206 can function to serve as an external connection to other systems. For example, the isolated contact 206 can connect to the substrate 104 or to a next level system. The isolated contact 206 can be partially embedded in the encapsulation 102, leaving the contact protrusion 208 and contact pad 218 exposed, along with part of the contact body 216.

The contact body 216 is includes the base structure of the isolated contact 206 from which the contact protrusion 208 extends, and the structure on which the contact pad 218 and the bond pad 250 can be formed. The contact body 216 can be made from many different materials such as copper, tin, zinc, or other conductive metal or alloys. For example, the contact body 216 can have a distinctive shape which includes the contact protrusion 208 and the side protrusion 220.

The side protrusion 220 is can be an extension coming out of the non-horizontal side of the isolated contact 206 or the die paddle 210. For example, the side protrusion 220 can be formed on the sides of the contact body 216 and can have different shapes. For example, if the side protrusions 220 are formed as part of an etching process, the side protrusions 220 can take the shape of two concave surfaces converging or merging to a point.

The contact protrusion 208 includes as a portion of the contact body 216 extending from the bottom of the isolated contact 206. The structure of the contact protrusion 208 includes the upper protrusion surface 222, the lower protrusion surface 224, and the protrusion sidewall 226. The contact protrusion 208 can be formed in a number of ways. For example, the contact protrusion 208 can be formed by stamping, cutting, drilling, etching, or other process for physically shaping metal.

The upper protrusion surface 222 includes the portion of the contact protrusion 208 on the outer perimeter of the contact protrusion 208. For example, the upper protrusion surface 222 can extend from the vertical edge of the bottom of the isolated contact 206 to the protrusion sidewall 226. The upper protrusion surface 222 can be horizontally planar.

The protrusion sidewall 226 can be the side of the contact protrusion 208 that extends vertically from the bottom of the isolated contact 206. For example, the protrusion sidewall 226 can extend from the inner edge of the upper protrusion surface 222 to the outer edge of the lower protrusion surface 224. The protrusion sidewall 226 can be vertically planar and can be perpendicular to the upper protrusion surface 222 and the lower protrusion surface 224.

The lower protrusion surface 224 is defined as the bottom of the contact protrusion 208 inside the area defined by the protrusion sidewall 226. For example, the lower protrusion surface 224 can be perpendicular to the protrusion sidewall 226 and can be horizontally planar. The lower protrusion surface 224 can also be parallel with the upper protrusion surface 222, for example. The lower protrusion surface 224, the upper protrusion surface 222, and the protrusion sidewall 226 can be covered by the contact pad 218.

It has been discovered that the contact protrusion 208 having a shape defined by the upper protrusion surface 222, the lower protrusion surface 224, and the protrusion sidewall 226 increases reliability of the connection between the isolated contact 206 and another system due to stronger resistance to multidirectional and shear forces in the solder used to connect the isolated contact 206 and another system. For example, because the solder will surround the contact protrusion 208, the resistance to shear forces is not determined merely by the contact adhesion but is also determined by the physical locking of the contact protrusion 208 in the solder. The lower protrusion surface 224 and the protrusion sidewall 226 extending into the solder can help prevent the solder from breaking or delaminating due to shear forces that can be caused by a difference in the thermal expansion of the substrate 104 and a package defined by the shape of the encapsulation 102.

The contact pad 218 can be a conductive material on the contact protrusion 208. The contact pad 218 can be a thin layer of conductive metal. The contact pad 218 covers only the upper protrusion surface 222, the lower protrusion surface 224, and the protrusion sidewall 226.

The contact pad 218 can be formed in a number of ways. For example, the contact pad 218 can be formed by a process such as sputtering, electroplating, or chemical vapor deposition (CVD). The contact pad 218 can be made from a metal such as gold, silver, nickel, copper, other conductive metal, or a solder-wettable material.

The bond pad 250 can be a conductive material on the top of the isolated contact 206. The bond pad 250 can be a thin layer of conductive metal. The bond pad 250 covers only the top of the isolated contact 206. The bond pad 250 can be formed in a number of ways. For example, the bond pad 250 can be formed by a process such as sputtering, electroplating, or chemical vapor deposition (CVD). The bond pad 250 can be made from a metal such as gold, silver, nickel, copper, other conductive material.

The substrate 104 can be a structure containing conductive traces and contacts. For example, the substrate 104 can be a laminate material, metallic, or some combination thereof. The substrate 104 includes the substrate contact 242. The substrate contact 242 is defined as the location where conductive material 244 will be used to connect to the isolated contact 206 or the die paddle 210.

The conductive material 244 can be a metallic mixture used to bridge contacts. For example, the conductive material 244 can be solder, a conductive paste, or a conductive resin. The conductive material 244 can bridge different kinds of contacts. For example, the conductive material 244 can connect the isolated contact 206 and the substrate contact 242. Also for example, the conductive material 244 can connect the die paddle 210 and the substrate contact 242.

The conductive material 244 can conform to the contact pad 218 if the contact pad 218 is formed from solder-wettable material. For example, the conductive material 244 can cover the upper protrusion surface 222, the lower protrusion surface 224, and the protrusion sidewall 226 while not covering the contact body 216.

It has been discovered that the contact protrusion 208 having a shape defined by the upper protrusion surface 222, the lower protrusion surface 224, and the protrusion sidewall 226 increases yields of good packages due to stronger resistance to multidirectional and shear forces in the conductive material 244 used to connect the isolated contact 206 and another system. For example, because the conductive material 244 will surround the contact protrusion 208, the resistance to shear forces is not determined merely by the contact adhesion of the conductive material 244 to the contact pad 218, but is also determined by the physical locking of the contact protrusion 208 in the conductive material 244. The lower protrusion surface 224 and the protrusion sidewall 226 extending into the conductive material 244 can help prevent the conductive material 244 from breaking or delaminating due to shear forces that can be caused by a difference in the thermal expansion of the substrate 104 and a package defined by the shape of the encapsulation 102.

Figure 4:
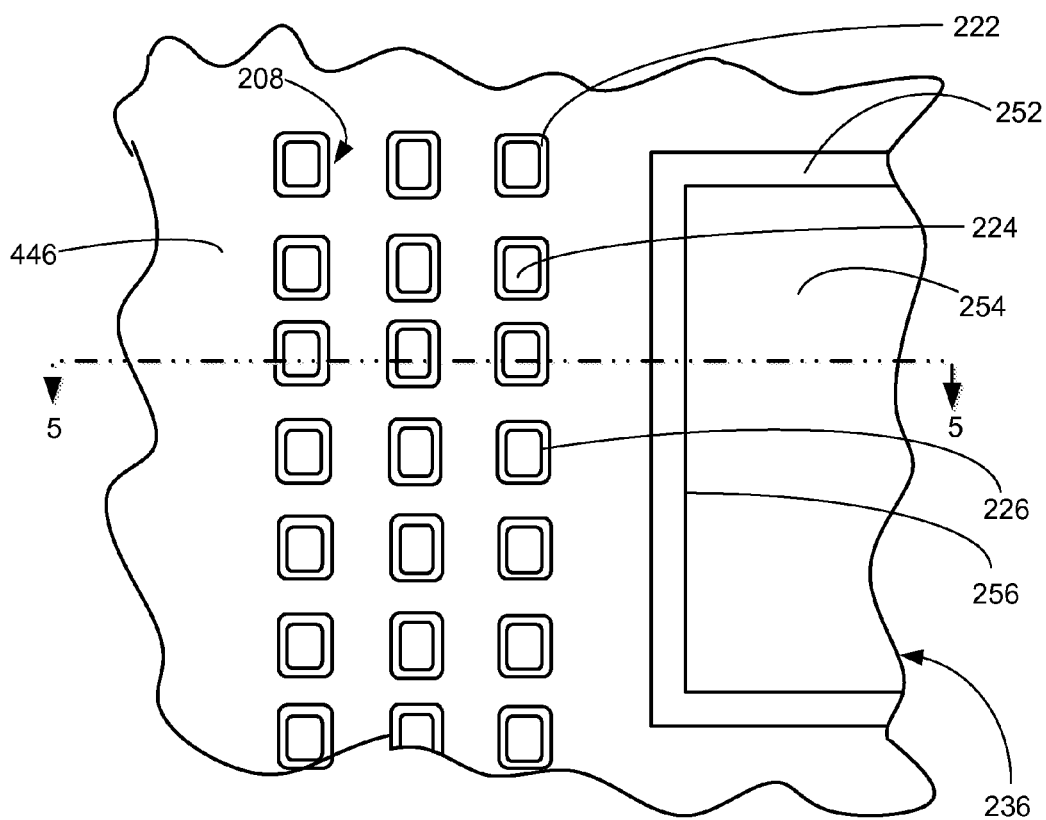
FIG. 4 is a partial bottom view of a leadframe and a contact pad in a manufacturing step of the integrated circuit packaging system.

Referring now to FIG. 4, therein is shown a partial bottom view of a leadframe 446 and the contact pad 218 in a manufacturing step of the integrated circuit packaging system 100. The leadframe 446 is shown having the contact pad 218 and the die paddle pad 236.

The leadframe 446 is defined as a contiguous conductive structure. The leadframe 446 can be processed before further manufacturing steps are performed. For example, the leadframe 446 can have the contact pad 218 and the die paddle pad 236 deposited on it via a process such as sputtering, electroplating, or chemical vapor deposition (CVD). The contact pad 218 and the die paddle pad 236 can be made from a metal such as gold, silver, nickel, copper, other conductive metal, or other solder-wettable material. Also for example, in order to assure that the contact pad 218 is only deposited where desired, the leadframe 446 can be masked before plating.

The contact pad 218 and the die paddle pad 236 can be deposited in different sizes and patterns. For example, the die paddle pad 236 can be deposited on the leadframe 446 surrounded by the contact pad 218 and can be larger in size than the contact pad 218. The contact pad 218 can be deposited around the die paddle pad 236 in different patterns. For example, the contact pad 218 can be deposited around the die paddle pad 236 in staggered rows, in a grid, or other regular pattern. The staggered row pattern can function to allow for closer packing of the contact pad 218; more instances of the contact pad 218 can be fit into the same amount of space.

The shape of the contact pad 218 is defined by the contact protrusion 208. The structure of the contact protrusion 208 includes the upper protrusion surface 222, the lower protrusion surface 224, and the protrusion sidewall 226. The contact protrusion 208 can be formed in a number of ways. For example, the contact protrusion 208 can be formed by stamping, cutting, drilling, etching, or other process for physically shaping the leadframe 446.

The shape of the die paddle pad 236 is defined by the die paddle protrusion 212. The structure of the die paddle protrusion includes the upper die protrusion surface 252, the lower die protrusion surface 254, and the die protrusion sidewall 256. The die paddle protrusion 212 can be formed in a number of ways. For example, the die paddle protrusion 212 can be formed by stamping, cutting, drilling, etching, or other process for physically shaping the leadframe 446.

Figure 5:
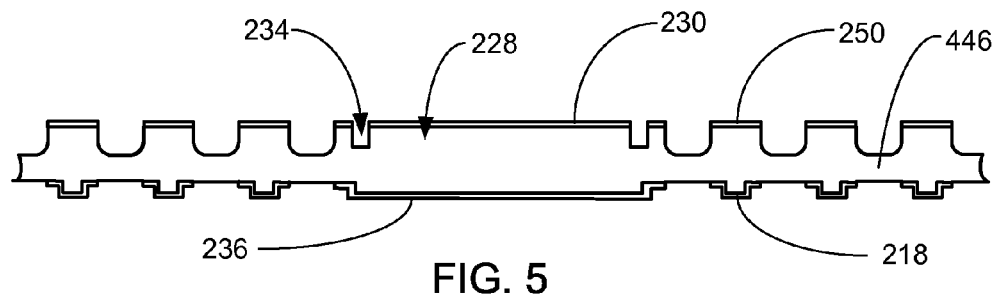
FIG. 5 is a partial cross-sectional view of the leadframe and the contact pad along the line 5-5 of FIG. 4.

Referring now to FIG. 5, therein is shown a partial cross-sectional view of the leadframe 446 and the contact pad 218 along the line 5-5 of FIG. 4. There are multiple steps taken in order to form the isolated contact 206 of FIG. 2 and the die paddle of FIG. 2. For example, the leadframe 446 can be etched before further processing. Before etching, the contact pad 218, the bond pad 250, the die attach pad 230, and the die paddle pad 236 can be applied to the top and bottom of the leadframe 446.

The bond pad 250 and the die attach pad 230 can resist the etching process and the leadframe 446 can be etched partially through top side of the leadframe 446, leaving recesses in the leadframe 446 between the areas covered by the bond pad 250 and the die attach pad 230. For example, the recesses can be of a depth so half the thickness of the leadframe 446 remains between the bottom of the recess and the component side of the leadframe 446.

The recesses can have curved corners as a result of the etching process. For example, the curved corners of the recesses can later form a portion of the side protrusions 220 of FIG. 2 after a later etching step from the bottom of the leadframe 446.

The leadframe 446 can be formed having the contact protrusion 208 of FIG. 2 in a number of ways. For example, the shape of the leadframe 446 can be formed by stamping, sawing, laser cutting, etching, or other process that can shape metal.

The leadframe 446 can be formed having the isolation groove 234 in a number of ways. For example, the isolation groove 234 can be formed in the top of the leadframe 446 by a process such as sawing, laser cutting, or drilling.

Figure 6:
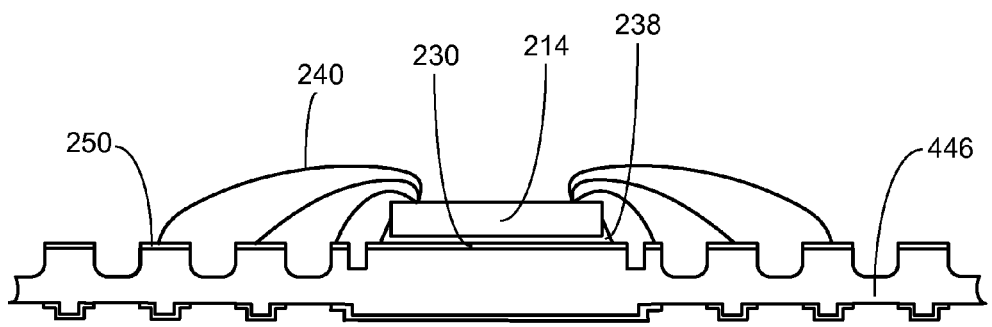
FIG. 6 is the structure of FIG. 5 in coupling the integrated circuit die to the leadframe in a further manufacturing step of the integrated circuit packaging system.

Referring now to FIG. 6, therein is shown the structure of FIG. 5 in coupling the integrated circuit die 214 to the leadframe 446 in a further manufacturing step of the integrated circuit packaging system 100. The integrated circuit packaging system 100 is shown in this step as having the integrated circuit die 214, the die attach adhesive 238, the bond wires 240, the bond pad 250, and the die attach pad 230.

The integrated circuit die 214 can be attached to the die paddle 210 on the die attach pad 230 with the die attach adhesive 238. The integrated circuit die 214 can then be connected to the isolated contact 206 by attaching the bond wires 240 from the active side of the integrated circuit die 214 to the bond pad 250 on the top of the isolated contact 206.

Figure 7:
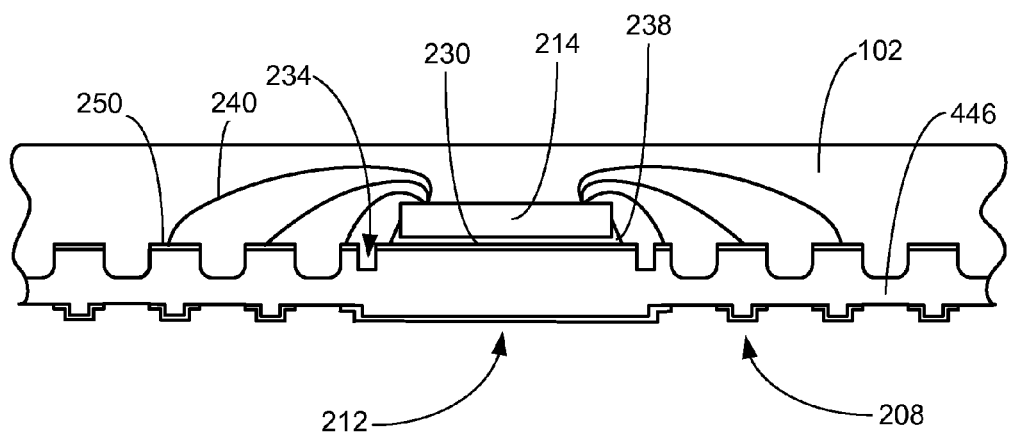
FIG. 7 is the structure of FIG. 6 after encapsulation in a further manufacturing step of the integrated circuit packaging system.

Referring now to FIG. 7, therein is shown the structure of FIG. 6 after encapsulation in a further manufacturing step of the integrated circuit packaging system 100. The encapsulation 102 is molded to the top surface of the leadframe 446.

The encapsulation 102 can be molded over many components. For example, the encapsulation 102 can cover the integrated circuit die 214, the bond wires 240, and the top of the leadframe 446, with the encapsulation 102 filling the isolation groove 234 and the recesses between the bond pad 250 and the die attach pad 230. The encapsulation 102 can cover only the top of the leadframe 446 so as to leave the contact protrusion 208 and the die paddle protrusion 212 exposed on the bottom of the leadframe 446.

Figure 8:
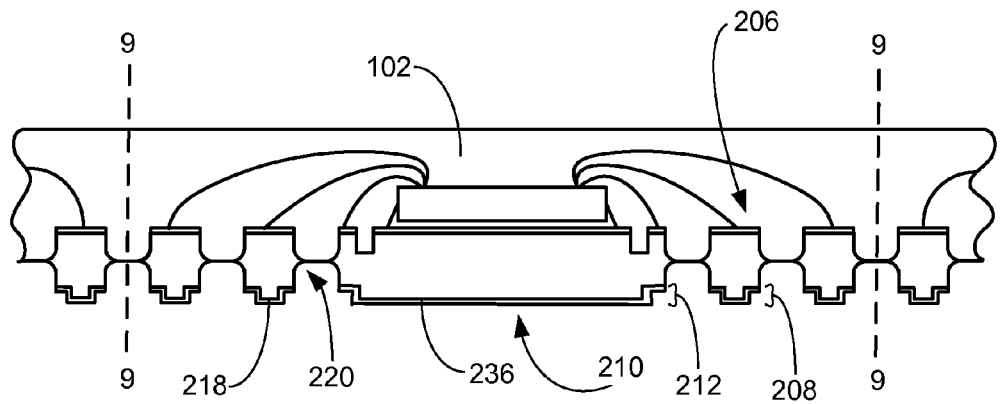
FIG. 8 is the structure of FIG. 7 in forming the isolated contact and the die paddle in a further manufacturing step of the integrated circuit packaging system.

Referring now to FIG. 8, therein is shown the structure of FIG. 7 in forming the isolated contact 206 and the die paddle 210 in a further manufacturing step of the integrated circuit packaging system 100. The leadframe 446 of FIG. 4 can be eroded from between the contact pad 218 and the die paddle pad 236 to form the isolated contact 206 and the die paddle 210 in different ways. For example, an etching step can etch through the remaining thickness on the bottom of the leadframe 446 and fully isolate the instances of the isolated contact 206 from each other and from the die paddle 210. Also for example, the etching step can etch through the leadframe 446 only in the areas not covered by the contact pad 218 and the die paddle pad 236.

After the etching step, the isolated contact 206 and the die paddle 210 can have different features. For example, the isolated contact 206 and the die paddle 210 can have the side protrusions 220 on the sides of the isolated contact 206 and the die paddle 210. The etching step can leave exposed from the encapsulation 102 part of the contact body 216 and the die paddle 210 above the contact protrusion 208 and the die paddle protrusion 212. Also for example, the encapsulation 102 can be exposed at the bottom of the structure of FIG. 8 between the isolated contact 206 and the die paddle 210 and the encapsulation 102 can be exposed at the bottom of the structure of FIG. 8 between instances of the isolated contact 206.

For illustrative purposes, the leadframe 446 is described as being removed from between the isolated contact 206 and the die paddle 210 with etching, though it is understood that the removal can be done differently. For example, the leadframe 446 can be removed by a process such as drilling or cutting.

Figure 9:
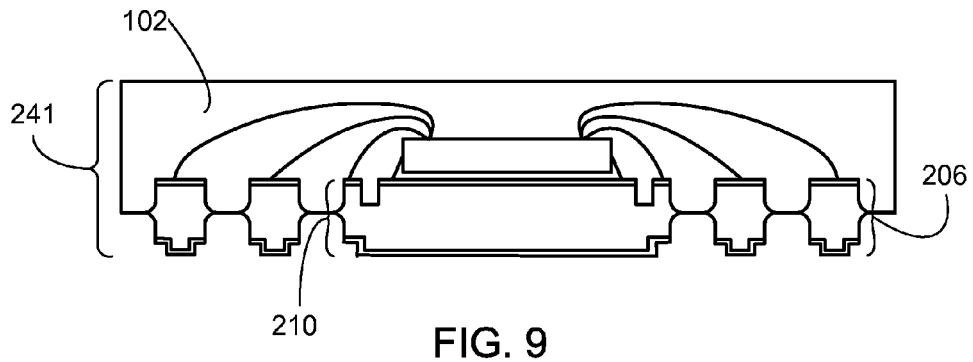
FIG. 9 is the structure of FIG. 8 after singulation along the singulation line 9-9 of FIG. 8 in a further manufacturing step of the integrated circuit packaging system.

Referring now to FIG. 9, therein is shown the structure of FIG. 8 after singulation along the singulation line 9-9 of FIG. 8 in a further manufacturing step of the integrated circuit packaging system 100. The structure of FIG. 8 is singulated by cutting through only the encapsulation 102 to form the integrated circuit package 241.

The encapsulation 102 can be separated in different ways. For example, the encapsulation 102 can be singulated by cutting, lasering, shearing, or sawing. The singulation process can produce the top section of the integrated circuit packaging system 100. The singulation process can create a vertical planar edge of the encapsulation 102 at the sides of the integrated circuit package 241.

It has been discovered that the isolated contact 206 being fully separated from the other instances of the isolated contact 206 but still held in place by the encapsulation 102 reduces stress on the integrated circuit packaging system 100 during singulation. One reason for this is that there is no connecting bar such as a tie bar holding the instances of the isolated contact 206 in place.

It has also been discovered that the reduction of stress on the integrated circuit packaging system 100 due to lack of stress on the isolated contact 206 and the die paddle 210 will reduce the chance of manufacturing defects. Because there is less stress on the isolated contact 206, the encapsulation 102 will conform closely to the isolated contact 206 even after singulation.

Figure 10:
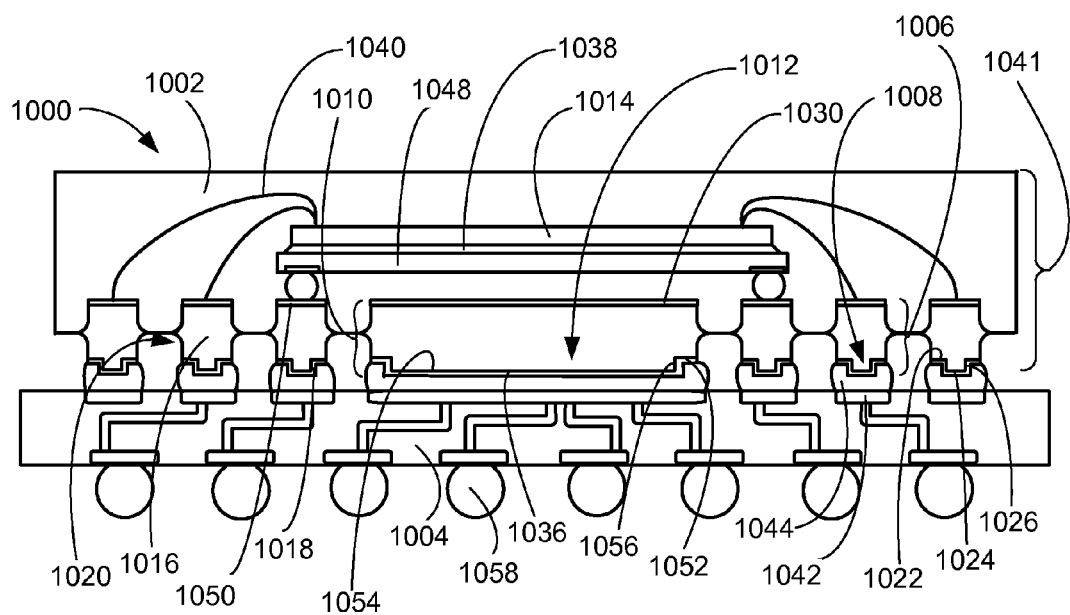
FIG. 10 is a cross-sectional view of the integrated circuit packaging system along the line 2-2 of FIG. 1 in a second embodiment of the present invention.

Referring now to FIG. 10, therein is shown a cross-sectional view of the integrated circuit packaging system 1000 along the line 2-2 of FIG. 1 in a second embodiment of the present invention. The integrated circuit packaging system 1000 is substantially similar to the integrated circuit packaging system 100 and is shown having an isolated contact 1006, a die paddle 1010, an integrated circuit die 1014, a flip chip 1048, an encapsulation 1002, and a substrate 1004, as an example.

The encapsulation 1002 is defined as a cover for surrounding and protecting the contents within the integrated circuit packaging system 1000 from the environment. For example, the encapsulation 1002 can be a material such as film assisted molding, epoxy molding, or other protective molding. The encapsulation 1002 can function to protect sensitive components from moisture, dust and other contamination.

The substrate 1004 is defined as a structure containing conductive traces and contacts. For example, the substrate 1004 can be a laminate material, metallic, ceramic, or some combination thereof. The substrate 1004 can have contact pads for connection to other components or next level systems. Also for example, the substrate 1004 can be larger than the encapsulation 1002.

For illustrative purposes, the substrate 1004 is described as being larger than the encapsulation 1002 although it is understood that the substrate 1004 may be a different relative size. For example, the substrate 1004 can be smaller or the same size as the encapsulation 1002.

The isolated contact 1006 is defined as a standalone interconnect structure with an extended feature on the bottom. The isolated contact 1006 includes a contact body 1016, a contact protrusion 1008, and a contact pad 1018. The isolated contact 1006 can function to serve as an external connection to other systems for the integrated circuit die 1014. For example, the isolated contact 1006 can connect to the substrate 1004 or to a next level system (not shown). The isolated contact 1006 can be partially embedded in the encapsulation 1002, leaving the contact protrusion 1008 and the contact pad 1018 exposed, along with part of the contact body 1016.

The contact body 1016 is defined as the base structure of the isolated contact 1006 from which the contact protrusion 1008 extends, and the structure on which the contact pad 1018 and the bond pad 1050 can be formed. The contact body 1016 can be made from many different materials such as copper, tin, zinc, or other conductive metal or alloys. For example, the contact body 1016 can have a distinctive shape which includes the contact protrusion 1008 and a side protrusion 1020.

The side protrusion 1020 is defined as an extension coming out of the non-horizontal side of the isolated contact 1006 or the die paddle 1010. For example, the side protrusion 1020 can be formed on the sides of the contact body 1016 and can have different shapes. For example, if the side protrusions 1020 are formed as part of an etching process, the side protrusions 220 can take the shape of two concave surfaces converging or merging to a point.

The contact protrusion 1008 is defined as a portion of the contact body 1016 extending from the bottom of the isolated contact 1006. The structure of the contact protrusion 1008 includes an upper protrusion surface 1022, a lower protrusion surface 1024, and a protrusion sidewall 1026. The contact protrusion 1008 can be formed in a number of ways. For example, the contact protrusion 1008 can be formed by stamping, cutting, drilling, etching, or other process for physically shaping metal.

The upper protrusion surface 1022 is defined as the portion of the contact protrusion 1008 on the outer perimeter of the contact protrusion 1008. For example, the upper protrusion surface 1022 can extend from the vertical edge of the bottom of the isolated contact 1006 to the protrusion sidewall 1026. The upper protrusion surface 1022 can be horizontally planar.

The protrusion sidewall 1026 is defined as the side of the contact protrusion 1008 that extends vertically from the bottom of the isolated contact 1006. For example, the protrusion sidewall 1026 can extend from the inner edge of the upper protrusion surface 1022 to the outer edge of the lower protrusion surface 1024. The protrusion sidewall 1026 can be vertically planar and can be perpendicular to the upper protrusion surface 1022 and the lower protrusion surface 1024.

The lower protrusion surface 1024 is defined as the bottom of the contact protrusion 1008 inside the area defined by the protrusion sidewall 1026. For example, the lower protrusion surface 1024 can be perpendicular to the protrusion sidewall 1026 and can be horizontally planar. The lower protrusion surface 1024 can also be parallel with the upper protrusion surface 1022, for example. The lower protrusion surface 1024, the upper protrusion surface 1022, and the protrusion sidewall 1026 can be covered by the contact pad 1018.

It has been discovered that the contact protrusion 1008 having a shape defined by the upper protrusion surface 1022, the lower protrusion surface 1024, and the protrusion sidewall 1026 increases reliability of the connection between the isolated contact 1006 and another system due to stronger resistance to multidirectional and shear forces in the solder used to connect the isolated contact 1006 and another system. For example, because the solder will surround the contact protrusion 1008, the resistance to shear forces is not determined merely by the contact adhesion but is also determined by the physical locking of the contact protrusion 1008 in the solder. The lower protrusion surface 1024 and the protrusion sidewall 1026 extending into the solder can help prevent the solder from breaking or delaminating due to shear forces that can be caused by a difference in the thermal expansion of the substrate 1004 and a package defined by the shape of the encapsulation 1002.

The contact pad 1018 is defined as a conductive material on the contact protrusion 1008. The contact pad 1018 can be a thin layer of conductive metal. The contact pad 1018 covers only the upper protrusion surface 1022, the lower protrusion surface 1024, and the protrusion sidewall 1026.

The contact pad 1018 can be formed in a number of ways. For example, the contact pad 1018 can be formed by a process such as sputtering, electroplating, or chemical vapor deposition (CVD). The contact pad 1018 can be made from a metal such as gold, silver, nickel, copper, other conductive metal, or a solder-wettable material.

The bond pad 1050 is defined as a conductive material on the top of the isolated contact 1006. The bond pad 1050 can be a thin layer of conductive metal. The bond pad 1050 covers only the top of the isolated contact 1006. The bond pad 1050 can be formed in a number of ways. For example, the bond pad 1050 can be formed by a process such as sputtering, electroplating, or chemical vapor deposition (CVD). The bond pad 1050 can be made from a metal such as gold, silver, nickel, copper, other conductive material.

The die paddle 1010 is defined as a supportive structure proximate to interface contacts and made from the same material as the interface contacts. For example, the die paddle 1010 can include a top surface 1028, a die attach pad 1030, the die paddle protrusion 1012, and a die paddle pad 1036. The die paddle 1010 can be made from many different materials such as copper, tin, zinc, or other conductive metal or alloys. For example, the die paddle 1010 can have a distinctive shape which includes the die paddle protrusion 1012 and the side protrusion 1020.

The side protrusion 1020 can be formed on the sides of the die paddle 1010 and can have different shapes. For example, if the side protrusions 1020 are formed as part of an etching process, they can take the shape of two concave surfaces converging or merging to a point.

The top surface 1028 is defined as the top of the die paddle 1010. The top surface 1028 can include the die attach pad 1030.

The die attach pad 1030 is defined as the location upon which the integrated circuit die 1014 is attached. The die attach pad 1030 can be a thin layer of conductive metal. The die attach pad 1030 can cover the top surface 1028 of the die attach pad 1030.

The die paddle protrusion 1012 is defined as a portion of the die paddle 1010 extending from the bottom of the die paddle 1010. The structure of the die paddle protrusion 1012 includes an upper die protrusion surface 1052, a lower die protrusion surface 1054, and a die protrusion sidewall 1056. The die paddle protrusion 1012 can be formed in a number of ways. For example, the die paddle protrusion 1012 can be formed by stamping, cutting, drilling, etching, or other process for physically shaping metal.

The upper die protrusion surface 1052 is defined as the portion of the die paddle protrusion 1012 on the outer perimeter of the die paddle protrusion 1012. For example, the upper die protrusion surface 1052 can extend from the vertical edge of the bottom of the die paddle 1010 to the die protrusion sidewall 1056. The upper die protrusion surface 1052 can be horizontally planar.

The die protrusion sidewall 1056 is defined as the side of the die paddle protrusion 1012 that extends vertically from the bottom of the die paddle protrusion 1012. For example, the die protrusion sidewall 1056 can extend from the inner edge of the upper die protrusion surface 1052 to the outer edge of the lower die protrusion surface 1054. The die protrusion sidewall 1056 can be vertically planar and can be perpendicular to the upper die protrusion surface 1052 and the lower die protrusion surface 1054.

The lower die protrusion surface 1054 is defined as the bottom of the die paddle protrusion 1012 inside the area defined by the die protrusion sidewall 1056. For example, the lower die protrusion surface 1054 can be perpendicular to the die protrusion sidewall 1056 and can be horizontally planar. The lower die protrusion surface 1054 can also be parallel with the upper die protrusion surface 1052, for example. The lower die protrusion surface 1054, the upper die protrusion surface 1052, and the die protrusion sidewall 1056 can be covered by the die paddle pad 1036.

It has been discovered that the die paddle protrusion 1012 having a shape defined by the upper die protrusion surface 1052, the lower die protrusion surface 1054, and the die protrusion sidewall 1056 increases reliability of the connection between the die paddle 1010 and another system due to stronger resistance to multidirectional and shear forces in the solder used to connect the die paddle 1010 and another system. For example, because the solder will surround the die paddle protrusion 1012, the resistance to shear forces is not determined merely by the contact adhesion but is also determined by the physical locking of the die paddle protrusion 1012 in the solder. The lower die protrusion surface 1054 and the die protrusion sidewall 1056 extending into the solder can help prevent the solder from breaking or delaminating due to shear forces that can be caused by a difference in the thermal expansion of the substrate 1004 and a package defined by the shape of the encapsulation 1002.

The die paddle pad 1036 is defined as a conductive metal on the die paddle protrusion 1012. The die paddle pad 1036 can be a thin layer of conductive metal. The die paddle pad 1036 covers only the upper die protrusion surface 1052, the lower die protrusion surface 1054, and the die protrusion sidewall 1056.

The die paddle pad 1036 can be formed in a number of ways. For example, the die paddle pad 1036 can be formed by a process such as sputtering, electroplating, or chemical vapor deposition (CVD). The die paddle pad 1036 can be made from a metal such as gold, silver, nickel, copper, other conductive metal, or a solder-wettable material.

The flip chip 1048 is defined as a chip containing active circuitry. The flip chip can be mounted with its active side down. For example, the flip chip 1048 can be mounted on the isolated contact 1006. The flip chip 1048 can be mounted on the isolated contact 1006 with solder balls. The flip chip 1048 can sit above the die paddle 1010 without contacting the die paddle 1010.

The integrated circuit die 1014 is defined as a chip containing active circuitry. The integrated circuit die 1014 is attached to the flip chip 1048 with a die attach adhesive 1038. The integrated circuit die 1014 is positioned above the die attach pad 1030. The die attach adhesive 1038 is defined as a substance used to bond two or more solid elements together. The die attach adhesive 1038 can be a resin, glue, paste, cement, putty, or a polyvinyl resin emulsion. The die attach adhesive 1038 can partially cover the flip chip 1048 and can have sides sloped away from the integrated circuit die 1014.

The integrated circuit die 1014 can be attached to the flip chip 1048 with the passive side facing down and the active side facing up. The integrated circuit die 1014 can be connected to the isolated contact 1006 with bond wires 1040.

An integrated circuit package 1041 includes the isolated contact 1006, the die paddle 1010, the integrated circuit die 1014, and the encapsulation 1002. The encapsulation 1002 separates a plurality of the isolated contact 1006 and maintains the structure of the integrated circuit package 1041.

The encapsulation 1002 can have a planar surface on the top and sides of the encapsulation 1002. The encapsulation can be exposed on the bottom surface of the encapsulation between the die paddle 1010 and the isolated contact 1006. The encapsulation 1002 can leave exposed the bottom of the isolated contact 1006 and the die paddle 1010.

The substrate 1004 can be a structure with conductive traces. For example, the substrate 1004 can be a laminate material, metallic, ceramic, or some combination thereof. The substrate 1004 includes a substrate contact 1042. The substrate contact 1042 is defined as the location where conductive material 1044 will be used to connect to the isolated contact 1006 or the die paddle 1010.

The conductive material 1044 is defined as a metallic mixture used to bridge contacts. For example, the conductive material 1044 can be solder, a conductive paste, or a conductive resin. The conductive material 1044 can bridge different kinds of contacts. For example, the conductive material 1044 can connect the isolated contact 1006 and the substrate contact 1042. Also for example, the conductive material 1044 can connect the die paddle 1010 and the substrate contact 1042.

The conductive material 1044 can conform to the contact pad 1018 if the contact pad 1018 is formed from solder-wettable material. For example, the conductive material 1044 can cover the upper die protrusion surface 1052, the lower die protrusion surface 1054, and the die protrusion sidewall 1056 while not covering the contact body 1016.

The substrate 1004 can have system interconnects 1058. The system interconnects 1058 are defined as an external connection for connection to a next level system (not shown). The system interconnects 1058 can be solder balls, solder bumps, solder columns, gold bumps, or stud bumps.

It has been discovered that the die paddle protrusion 1012 and the contact protrusion 1008 having a shape defined by the upper die protrusion surface 1052, the lower die protrusion surface 1054, and the die protrusion sidewall 1056 lowers the defect rate of the connection between the isolated contact 1006 or the die paddle 1010 and another system due to stronger resistance to multidirectional and shear forces in the conductive material 1044 used to connect the isolated contact 1006 and another system. For example, because the conductive material 1044 will surround the contact protrusion 1008, the resistance to shear forces is not determined merely by the contact adhesion of the conductive material 1044 to the contact pad 1018, but is also determined by the physical locking of the contact protrusion 1008 in the conductive material 1044. The lower die protrusion surface 1054 and the die protrusion sidewall 1056 extending into the conductive material 1044 can help prevent the conductive material 1044 from breaking or delaminating due to shear forces that can be caused by a difference in the thermal expansion of the substrate 1004 and the integrated circuit package 1041.

Figure 11:
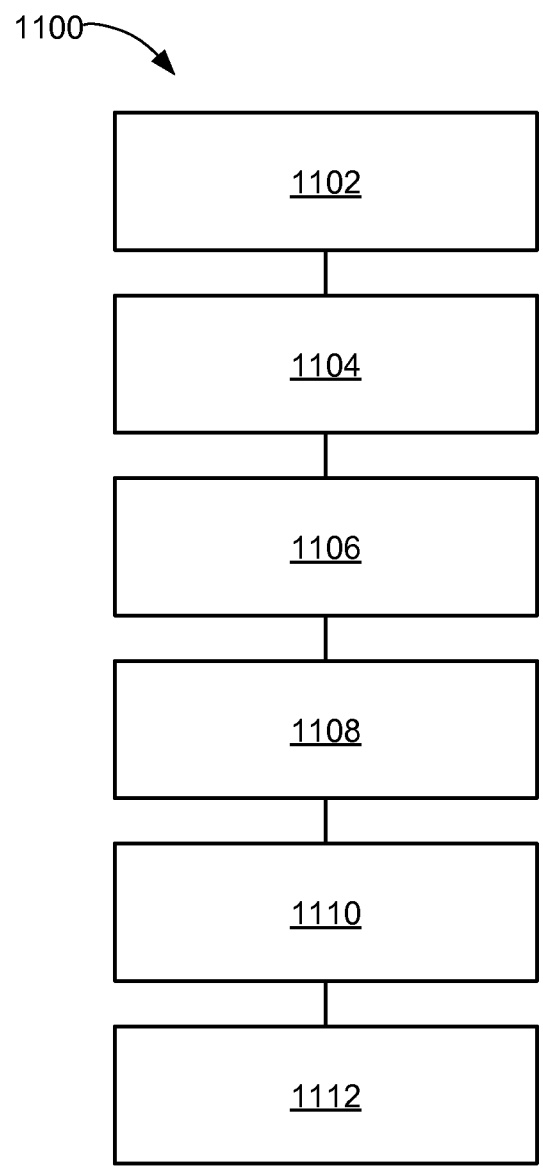
FIG. 11 is a flow chart of a method of manufacture of the integrated circuit packaging system in a further embodiment of the present invention.

Referring now to FIG. 11, therein is shown a flow chart of a method 1100 of manufacture of the integrated circuit packaging system in a further embodiment of the present invention. The method 1100 includes: forming a leadframe having a die paddle protrusion and a contact protrusion, the die paddle protrusion and the contact protrusion having a lower protrusion surface, an upper protrusion surface, and a protrusion sidewall in a block 1102; depositing a contact pad on the contact protrusion in a block 1104; depositing a die paddle pad on the die paddle protrusion in a block 1106; coupling an integrated circuit die to the leadframe in a block 1108; molding an encapsulation on the integrated circuit die and leadframe in a block 1110; and forming an isolated contact from the contact protrusion in a block 1112.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems and are fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   an isolated contact having a contact body, a side protrusion, and a contact protrusion, the side protrusion having a curved surface, the contact protrusion having a contact pad on a lower protrusion surface, an upper protrusion surface, and a protrusion sidewall;
   a die paddle having a die paddle protrusion, the die paddle protrusion having a die paddle pad on a lower die protrusion surface, an upper die protrusion surface, and a die protrusion sidewall;
   an integrated circuit die over the die paddle protrusion; and
   an encapsulation on the integrated circuit die and partially covering the isolated contact, the contact pad and part of the contact body exposed from the encapsulation.

2. The system as claimed in claim 1 further comprising:
   a substrate having a substrate contact; and
   conductive material between the contact protrusion and the substrate contact, the conductive material covering only the substrate contact and the contact pad.

3. The system as claimed in claim 1 wherein the die paddle includes:
   a die attach pad on a top surface of the die paddle;
   a die paddle perimeter on the top surface of the die paddle; and
   an isolation groove between the die attach pad and the die paddle perimeter in the top surface of the die paddle.

4. The system as claimed in claim 1 wherein the contact protrusion extends from a bottom surface of the isolated contact, with the upper protrusion surface along a perimeter region of the isolated contact and the protrusion sidewall along a perimeter region of the lower protrusion surface.

5. The system as claimed in claim 1 further comprising:
   a bond pad over the contact protrusion; and
   bond wires connecting the integrated circuit die and the bond pad.

6. The system as claimed in claim 1 further comprising:
   a substrate having a substrate contact;
   conductive material between the contact protrusion and the substrate contact, the conductive material covering only the substrate contact and the contact pad;
   a bond pad over the contact protrusion;
   bond wires connecting the integrated circuit die and the bond pad; and
   wherein:
   the contact protrusion extends from a lower surface of the isolated contact, with the upper protrusion surface along a perimeter region of the isolated contact and the protrusion sidewall along a perimeter region of the lower protrusion surface.

7. The system as claimed in claim 6 wherein the contact pad is formed from solder-wettable material.

8. The system as claimed in claim 6 further comprising a plurality of the isolated contact around the die paddle.

9. The system as claimed in claim 6 further comprising a flip chip connected to the isolated contact.

10. The system as claimed in claim 6 further comprising a die attach adhesive between a flip chip and the integrated circuit die.

* * * * *